(12) United States Patent
Sugawara et al.

(10) Patent No.: US 9,705,429 B2
(45) Date of Patent: Jul. 11, 2017

(54) POWER GENERATING ELEMENT, LIGHT EMITTING ELEMENT, BAND-LIKE LIGHT EMITTING BODY, AND RESCUE DISPLAY DEVICE

(71) Applicants: Tomoaki Sugawara, Kanagawa (JP); Junichiro Natori, Kanagawa (JP); Tsuneaki Kondoh, Kanagawa (JP); Yuko Arizumi, Kanagawa (JP); Takahiro Imai, Tokyo (JP); Mizuki Otagiri, Kanagawa (JP); Mayuka Araumi, Tokyo (JP); Megumi Kitamura, Tokyo (JP)

(72) Inventors: Tomoaki Sugawara, Kanagawa (JP); Junichiro Natori, Kanagawa (JP); Tsuneaki Kondoh, Kanagawa (JP); Yuko Arizumi, Kanagawa (JP); Takahiro Imai, Tokyo (JP); Mizuki Otagiri, Kanagawa (JP); Mayuka Araumi, Tokyo (JP); Megumi Kitamura, Tokyo (JP)

(73) Assignee: Ricoh Company, Ltd., Tokyo (JP)

(*) Notice: Subject to any disclaimer, the term of this patent is extended or adjusted under 35 U.S.C. 154(b) by 0 days.

(21) Appl. No.: 15/269,183

(22) Filed: Sep. 19, 2016

(65) Prior Publication Data

US 2017/0093305 A1 Mar. 30, 2017

(30) Foreign Application Priority Data

Sep. 28, 2015 (JP) .................. 2015-189637

(51) Int. Cl.
*H02N 2/18* (2006.01)
*H01L 41/113* (2006.01)
(Continued)

(52) U.S. Cl.
CPC ........... *H02N 2/186* (2013.01); *B63C 9/0005* (2013.01); *B63C 9/20* (2013.01); *F21V 33/0076* (2013.01);
(Continued)

(58) Field of Classification Search
CPC ................................ H02N 2/18; H01L 41/113
(Continued)

(56) References Cited

U.S. PATENT DOCUMENTS

| 4,814,661 A * | 3/1989 | Ratzlaff .................. A01L 11/00 310/319 |
| 2002/0097157 A1 * | 7/2002 | Piri ...................... B63C 9/0005 340/573.1 |

(Continued)

FOREIGN PATENT DOCUMENTS

| JP | 2010-104105 | 5/2010 |
| JP | 2014-027756 | 2/2014 |

(Continued)

*Primary Examiner* — J. San Martin
(74) *Attorney, Agent, or Firm* — Oblon, McClelland, Maier & Neustadt, L.L.P.

(57) ABSTRACT

A power generating element is provided. The power generating element includes a pair of electrodes and an intermediate layer disposed between the pair of electrodes. The intermediate layer includes an insulating elastic body. The power generating element is flexibly bendable when receiving an external force, while causing a sliding transfer between at least one of the electrodes and at least one surface of the intermediate layer which faces the at least one of the electrodes, due to a difference in curvature between the electrodes and the intermediate layer.

9 Claims, 10 Drawing Sheets

(51) Int. Cl.
  *H01L 41/047* (2006.01)
  *F21V 33/00* (2006.01)
  *B63C 9/20* (2006.01)
  *B63C 9/00* (2006.01)
(52) U.S. Cl.
  CPC ........ *H01L 41/047* (2013.01); *H01L 41/1134* (2013.01); *H02N 2/181* (2013.01)
(58) Field of Classification Search
  USPC ......................................................... 310/339
  See application file for complete search history.

(56) References Cited

U.S. PATENT DOCUMENTS

| | | | | |
|---|---|---|---|---|
| 2003/0211797 | A1* | 11/2003 | Hill | D03D 1/0088 442/205 |
| 2010/0244629 | A1* | 9/2010 | Nagashima | H01L 41/053 310/339 |
| 2014/0035735 | A1* | 2/2014 | Zellers | G08B 6/00 340/407.2 |
| 2014/0111063 | A1* | 4/2014 | Bae | H01L 41/113 310/339 |
| 2015/0008798 | A1* | 1/2015 | Kato | H02N 2/18 310/339 |
| 2015/0202656 | A1* | 7/2015 | Takahashi | H01L 41/0986 310/300 |
| 2016/0276957 | A1* | 9/2016 | Sugawara | H02N 2/186 |
| 2016/0336505 | A1* | 11/2016 | Arizumi | H01L 41/113 |
| 2016/0341381 | A1* | 11/2016 | Imai | F21S 9/04 |
| 2016/0344309 | A1* | 11/2016 | Otagiri | H02N 2/18 |

FOREIGN PATENT DOCUMENTS

| | | |
|---|---|---|
| JP | 2014-042444 | 3/2014 |
| JP | 2014-111911 | 6/2014 |
| JP | 2014-239647 | 12/2014 |

* cited by examiner

POWER GENERATING ELEMENT, LIGHT EMITTING ELEMENT, BAND-LIKE LIGHT EMITTING BODY, AND RESCUE DISPLAY DEVICE

CROSS-REFERENCE TO RELATED APPLICATIONS

This patent application is based on and claims priority pursuant to 35 U.S.C. §119(a) to Japanese Patent Application No. 2015-189637, filed on Sep. 28, 2015, in the Japan Patent Office, the entire disclosure of which is hereby incorporated by reference herein.

BACKGROUND

Technical Field

The present disclosure relates to a power generating element, a light emitting element, a band-like light emitting body, and a rescue display device.

Description of the Related Art

There have been attempts to convert vibration energy into electric energy. Vibration energy is generally generated from vibrations caused by structural bodies (e.g., roads, bridges, buildings, and industrial machineries), moving bodies (e.g., automobiles, railroad vehicles, and aircrafts), and human body movements, and from environmental vibrations existing universally.

As one method of converting vibration energy into electric energy, a method using a piezoelectric element is known.

SUMMARY

In accordance with some embodiments of the present invention, a power generating element is provided. The power generating element includes a pair of electrodes and an intermediate layer disposed between the pair of electrodes. The intermediate layer includes an insulating elastic body. The power generating element is flexibly bendable when receiving an external force, while causing sliding motion between at least one of the electrodes and at least one surface of the intermediate layer which faces the at least one of the electrodes, due to a difference in curvature between the electrodes and the intermediate layer.

In accordance with some embodiments of the present invention, a light emitting element is provided. The light emitting element includes the above the power generating element and a light emitting diode connected to the power generating element via a rectifier circuit.

In accordance with some embodiments of the present invention, a band-like light emitting body is provided. The band-like light emitting body includes a plurality of the above light emitting elements connected to each other in a band-like shape.

In accordance with some embodiments of the present invention, a rescue display device is provided. The rescue display device includes a float member and the above band-like light emitting body installed to the float member.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

The accompanying drawings are intended to depict example embodiments of the present invention and should not be interpreted to limit the scope thereof. The accompanying drawings are not to be considered as drawn to scale unless explicitly noted.

DETAILED DESCRIPTION

Embodiments of the present invention are described in detail below with reference to accompanying drawings. In describing embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

For the sake of simplicity, the same reference number will be given to identical constituent elements such as parts and materials having the same functions and redundant descriptions thereof omitted unless otherwise stated.

In accordance with some embodiments of the present invention, a power generating element having excellent power generation performance and a long life span is provided.

Figure 1:
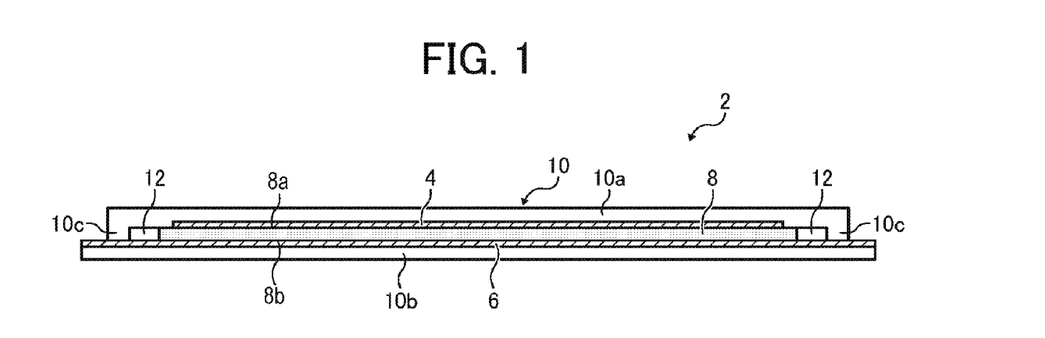
FIG. 1 is a vertical cross-sectional view of a power generating element according to a first embodiment of the present invention.

FIG. 1 is a cross-sectional view of a power generating element according to a first embodiment of the present invention.

Referring to FIG. 1, a power generating element 2 includes a pair of electrodes including an upper electrode 4 and a lower electrode 6, a silicone rubber member 8, and an exterior film 10 having flexibility. The upper electrode 4 and the lower electrode 6 are flexible. The silicone rubber member 8 serves as the insulating elastic body included in the intermediate layer disposed between the upper electrode 4 and the lower electrode 6. The exterior film 10 seals these members therein. Hereinafter, the cross-section of the exterior film 10 is omitted from the drawings for the sake of simplicity. A reference numeral 12 denotes a space.

The exterior film 10 may include PET (polyethylene terephthalate). The exterior film 10 includes an upper film 10*a*, a lower film 10*b*, and a thermocompression part 10*c*. A sealed structure is formed by the upper film 10*a*, the lower film 10*b*, and the thermocompression part 10*c*.

The upper electrode 4, the lower electrode 6, and the silicone rubber member 8 are sealed within the exterior film 10, forming one cell.

Each constitutional element of the power generating element 2 has flexibility. Therefore, the power generating element 2 as a whole is bendable when receiving an external force. The degree of flexibility of the power generating element 2 is such that the element is gently bendable in water when naturally-generated wave acts thereon.

Figure 2A:
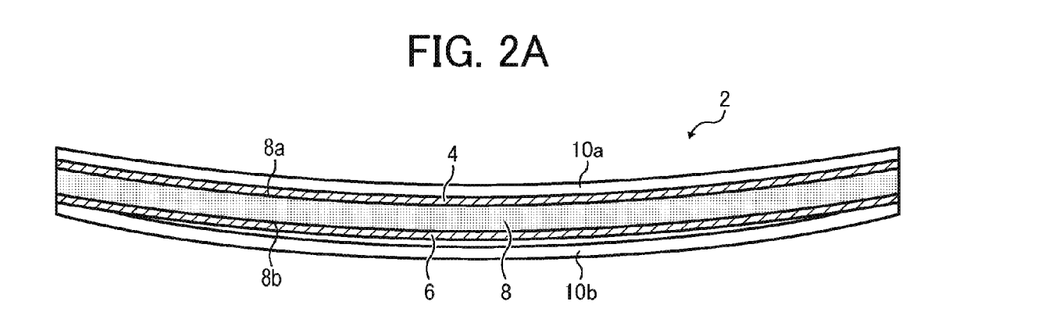
FIGS. 2A and 2B are schematic views illustrating a bending deformation of the power generating element.

The silicone rubber member 8 is joined to neither the upper electrode 4 nor the lower electrode 6. Therefore, when the power generating element 2 is bent such that the lower electrode 6 side thereof is curved outward, as illustrated in FIG. 2A, sliding motion (frictional sliding) is caused either between the upper electrode 4 and a surface (8*a*) of the silicone rubber member 8 which faces the upper electrode 4, or between the lower electrode 6 and the other surface (8*b*) of the silicone rubber member 8 which faces the lower electrode 6.

Figure 2B:
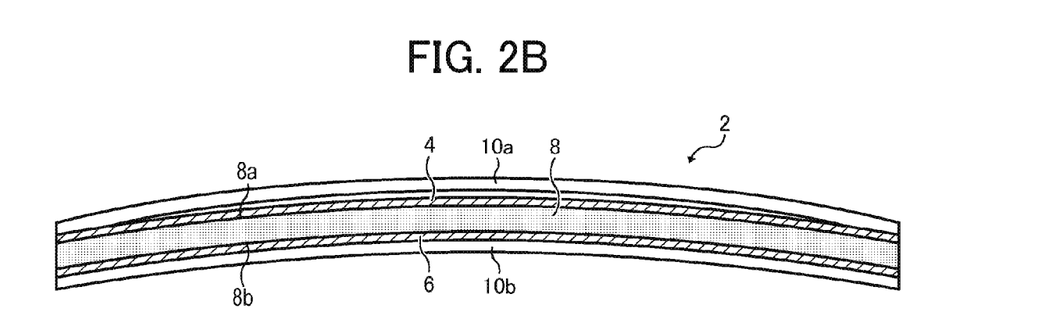

The same phenomenon occurs when the power generating element 2 is bent such that the upper electrode 4 side thereof is curved outward, as illustrated in FIG. 2B.

Figure 3A:
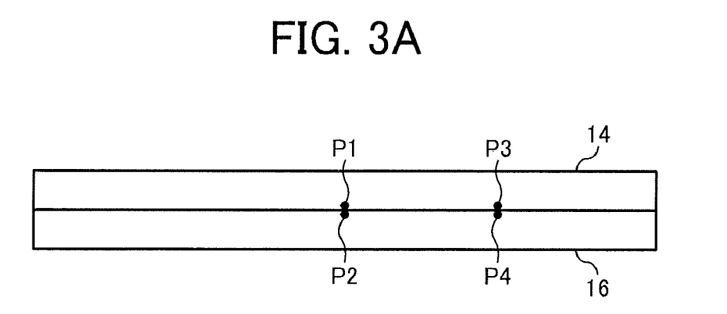
FIGS. 3A and 3B are schematic views for explaining a principle of power generation caused by bending deformation of the power generating element.

A principle of this phenomenon is explained below with reference to FIGS. 3A and 3B. FIG. 3A illustrates an upper member 14 and a lower member 16 having the same length, overlaid on one another. P1 and P2 are center points of the upper member 14 and the lower member 16, respectively. P3 is a point on the upper member 14 on a right side of the center point P1, and P4 is a point on the lower member 16 aligned with P3.

Figure 3B:
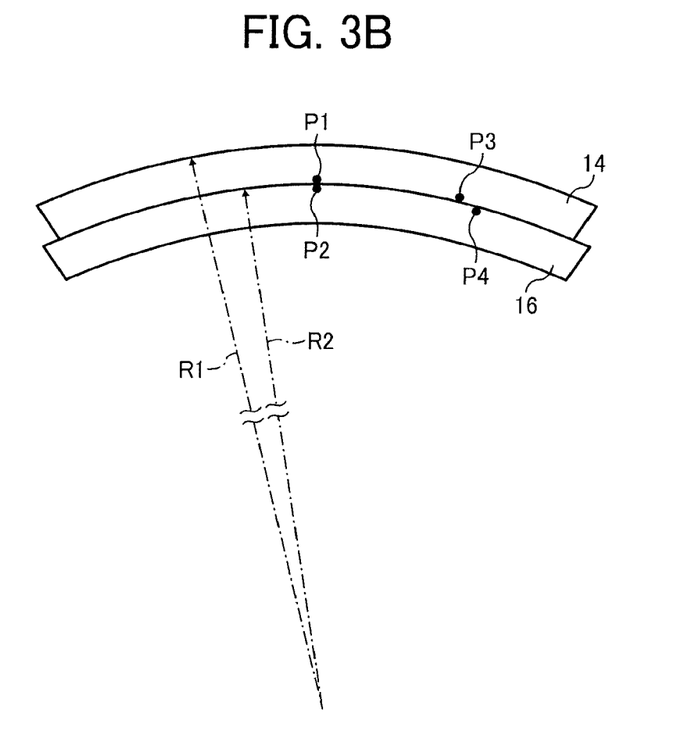

When the two members 14 and 16 are bent such that the upper sides thereof are curved outward while being kept overlaid on one another, as illustrated in FIG. 3B, the center points P1 and P2 are kept aligned but the points P3 and P4 become misaligned due to a difference in curvature 1/R1 and 1/R2, caused by a difference in curvature radius R1 and R2, between the upper member 14 and the lower member 16. The same phenomenon occurs on the left sides of the two members 14 and 16.

Since the amount of bending deformation is larger in the lower member 16 having a larger curvature, the lower member 16 causes a misalignment relative to the upper member 14. Since the upper member 14 and the lower member 16 are not joined to each other, sliding motion is caused therebetween. The same phenomenon occurs when the two members 14 and 16 are bent such that the lower sides thereof are curved outward.

The above-described phenomenon refers to a case in which an external force acts on the center points of the two members, to cause a symmetric misalignment. There may be another case in which the two members are bent with one ends thereof being fixed, to cause sliding motion at the free end sides of the members.

In the present embodiment, the electrodes are fixed in part, to be described in detail later. At the rest parts of the electrodes without being fixed, relative displacement caused by the difference in curvature is adsorbed by the sliding motion. Therefore, stress concentration can be made very small.

The power generating element 2 according to an embodiment of the present invention is easily deformable since no strong connection or junction part exists therein and stress concentration is unlikely to occur.

The amount of misalignment is enlarged as the thickness of the element is increased. For example, in a case in which the curvature radius is 30 mm, when an element having a thickness of 500 µm is bent by 90 degrees, the amount of misalignment becomes 1.7%. In this case, an element having a connection or junction part will cause a high degree of stress concentration, while the element according to an embodiment of the present invention causes sliding motion to avoid such a phenomenon.

In the present embodiment, the upper electrode 4 or the lower electrode 6 slides over the silicone rubber member 8 while contacting the silicone rubber member 8, thus generating electrostatic charge or internal charge, i.e., generating power.

Thus, the power generating element 2 according to the present embodiment does not need charge injection in its production process.

Specific examples of usable electrode materials include, but are not limited to: polymer films on which a thin film of a metal (e.g., gold, silver, copper, aluminum, stainless steel, tantalum, nickel) is vapor-deposited or attached; and metal-composite woven or non-woven fabrics. Specific examples of usable electrode materials further include conductive rubber compositions.

The conductive rubber composition preferably includes, as a base rubber, silicone rubber, modified silicone rubber, acrylic rubber, chloroprene rubber, polysulfide rubber, polyurethane rubber, polyisobutyl rubber, fluorosilicone rubber, ethylene rubber, and natural rubber (latex).

The conductive rubber composition preferably includes, as a conductive filler, at least one of carbon materials (e.g., Ketjen black, acetylene black, graphite, carbon fiber (CF), carbon nanofiber (CNF), carbon nanotube (CNT)), metal fillers (e.g., gold, silver, platinum, copper, aluminum), conductive polymeric materials (e.g., derivatives of polythiophene, polyacetylene, polyaniline, polypyrrole, polyparaphenylene, or polyparaphenylene vinylene, to which a dopant, such as anion and cation, may be added), and ionic liquids serving as organic fillers having a large polarity.

In particular, a flexible film on which an electrode is sputter-deposited or attached (i.e., a flexible film integrated with an electrode) is preferably used, to shorten the processing time period.

The silicone rubber member 8 may contain functional fillers for improving power generating property. Specific examples of the functional fillers include, but are not limited to, titanium oxide, barium oxide, silica, calcium carbonate, carbon nanotube, iron oxide, PTFE (polytetrafluoroethylene), mica, and clay minerals.

The silicone rubber member 8 preferably has a film thickness in the range of from 10 µm to 10 mm, more preferably from 50 to 200 µm, from the aspect of deformation following property as a thin film, but is not limited thereto. When the film thickness is less than 10 µm, the silicone rubber member 8 cannot secure film forming property and may tear without generating power. When the film thickness is in excess of 10 mm, the element may be prevented from deforming and the amount of power generation may be significantly reduced. Preferably, the intermediate layer is insulating. Specifically, the intermediate layer has a volume resistivity of $10^8$ Ωcm or more, more preferably $10^{10}$ Ωcm or more.

According to an embodiment of the present invention, a surface of the silicone rubber member 8 which faces the upper electrode 4 (e.g., surface 8a) or the lower electrode 6 (e.g., surface 8b), between which sliding motion is caused, is surface-modified.

The surface modification may be performed by plasma treatment, corona discharge, electron irradiation, ultraviolet irradiation, ozone treatment, and/or irradiation of radiation (e.g., α-ray, β-ray, γ-ray, neutron ray). From the aspect of processing speed, plasma treatment, corona discharge, and electron irradiation are preferable. The surface modification process is not limited to any particular process so long as a certain degree of irradiation energy is sufficiently provided to modify a material.

In the case of corona discharge, the amount of energy load is in the range of from 100 to 5,000 W·min/m², preferably from 200 to 1,000 W·min/m². When the amount of energy load is less than 100 W·min/m², power generation function may not be emerged. When the amount of energy load is in excess of 5,000 W·min/m², the surface of the intermediate layer may crack, significantly reducing durability.

In the case of electron irradiation, the irradiation dose is 1 kGy or more, preferably in the range of from 300 kGy to 10 MGy. When the irradiation dose is less than 1 kGy, power generation function may not be emerged. When the irradiation dose is in excess of 10 MGy, the surface of the intermediate layer may crack, significantly reducing durability. The irradiation may be performed in an inert gas atmosphere, such as argon, neon, helium, and nitrogen gas, which has an oxygen partial pressure of 5,000 ppm or less. When the oxygen partial pressure is in excess of 5,000 ppm, ozone is generated in so large amounts that an ozone treatment equipment may be needed.

In the case of ultraviolet irradiation, an ultraviolet light having a wavelength of from 200 to 365 nm, preferably from 240 to 320 nm, is emitted until the accumulated amount of ultraviolet light ranges from 5 to 500 J/cm², preferably from 50 to 200 J/m². When the accumulated amount of ultraviolet light is less than 5 J/cm², power generation function may not be emerged. When the accumulated amount of ultraviolet light is in excess of 500 J/cm², the surface of the intermediate layer may crack, significantly reducing durability. The irradiation may be performed in an inert gas atmosphere, such as argon, neon, helium, and nitrogen gas, which has an oxygen partial pressure of 5,000 ppm or less. When the oxygen partial pressure is in excess of 5,000 ppm, ozone is generated in so large amounts that an ozone treatment equipment may be needed.

The surface-modified silicone rubber member 8 has no initial surface potential. The surface potential of the silicone rubber member 8 after the surface modification is measured under the following conditions.

Measurement Conditions
Surface potentiometer: Model 344 (product of TREK JAPAN KK)
Measurement distance: 3 mm
Measurement spot diameter: 20 mm In accordance with some embodiments of the present invention, a principle of power generation is considered as follows. First, sliding motion is caused between the electrode and the silicone rubber member 8 when a load (an external force) is applied thereto. The sliding motion causes triboelectric charging, and the triboelectric charging induces power generation. More specifically, a surface potential difference is generated between the electrode and the silicone rubber member 8 since the silicone rubber member 8 retains electrostatic charge and internal charge. The surface potential difference further generates an electrostatic capacity bias due to the deformation amount difference caused based on the hardness difference. Thus, charge transfer occurs. Depending on the configuration, power generation may be caused by peeling electrification.

Conventionally, interlayer adhesion force is improved by forming active groups by means of excitation or oxidization caused by corona discharge, ultraviolet treatment, or electron irradiation. Such active groups have a limited application to improvement of interlayer adhesion force. It is known that application of the active groups to outermost surface modification treatments causes a significant deterioration in releasability of the outermost surface, which is not preferable. In addition, conventionally, a reactive active group (e.g., hydroxyl group) is efficiently introduced under an oxygen-rich reaction condition.

In accordance with some embodiments of the present invention, a plasma treatment under a reduced-pressure environment with a small amount of oxygen is employed. Such a plasma treatment accelerates re-cross-linkage or recombination of the surface and increases the number of Si—O bonds having a high bond energy, improving the durability of the surface. In addition, since the surface is densified owing to the increased cross linkage density, the releasability of the surface is also improved.

In accordance with some embodiment of the present invention, no adhesion structure exists between the electrode and the intermediate layer. Therefore, even when a gap is formed between the electrode and the intermediate layer upon deformation, no electric discharge is observed.

Having generally described this invention, further understanding can be obtained by reference to certain specific examples which are provided herein for the purpose of illustration only and are not intended to be limiting. In the descriptions in the following examples, the numbers represent weight ratios in parts, unless otherwise specified.

EXAMPLE 1

As the upper electrode 4 and the lower electrode 6, an AL-PET® 9-100 electrode (available from PANAC Co., Ltd., including an aluminum foil having a thickness of 9 μm and a polyethylene terephthalate film having a thickness of 100 μm) was used.

As the intermediate layer, a silicone rubber (TSE3033 available from Momentive Performance Materials Inc.) having a blade-coating layer with a thickness of about 100±10 μm was used. The silicone rubber was burnt at a high temperature of about 120° C. for 30 minutes and then subjected to a corona discharge treatment, in which the applied voltage was set to 100 V and the accumulated energy was set to 500 J/cm², as a surface modification treatment.

The surface-modified intermediate layer was formed into a piece with longitudinal and lateral sides having lengths of 20 mm and 50 mm, respectively.

Figure 4:
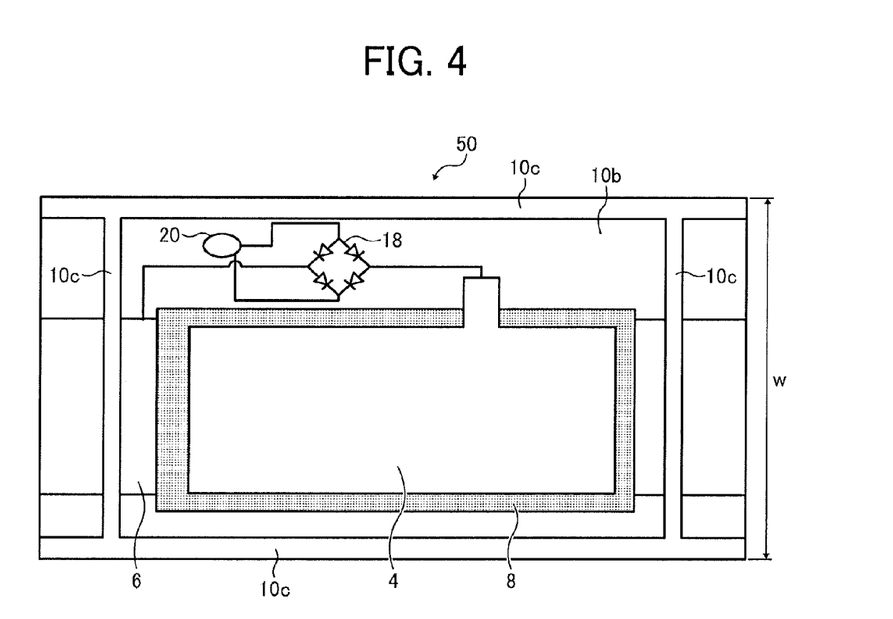
FIG. 4 is a horizontal cross-sectional view of a light emitting element according to a second embodiment of the present invention.

The intermediate layer (silicone rubber) was sandwiched between the upper electrode 4 and the lower electrode 6, as illustrated in FIG. 1. The aluminum foils of the electrodes 4 and 6 were patterned into respective shapes illustrated in FIG. 4. Specifically, the lower electrode 6 was patterned into a continuous band-like shape, and the upper electrode 4 was patterned into a shape to be put on the silicone rubber member 8. FIG. 4 is a schematic view of a light emitting element 50, according to a second embodiment of the present invention, from which the upper film 10a of the exterior film 10 has been removed, viewed from the upper side.

The upper electrode 4 and the lower electrode 6 were connected to an LED (light emitting diode) 20 via a bridge diode 18 serving as a rectifier circuit. The upper film 10a and the lower film 10b of the exterior film 10 were thermocompressed at the thermocompression part 10c to form a sealed part. The sealed part had a with W of 30 mm.

When evaluating power generation performance, the LED 20 was connected to an oscilloscope (Wave Ace 1001 available from LeCroy Corporation) with a wire.

Evaluation 1: Power Generation Performance

As a vibration tester, a combination of a Function Generator SG-1405 (product of IWATSU ELECTRIC CO., LTD.) and a vibration tester MES 151 (product of Mitutoyo Corporation) was used.

Figure 5:
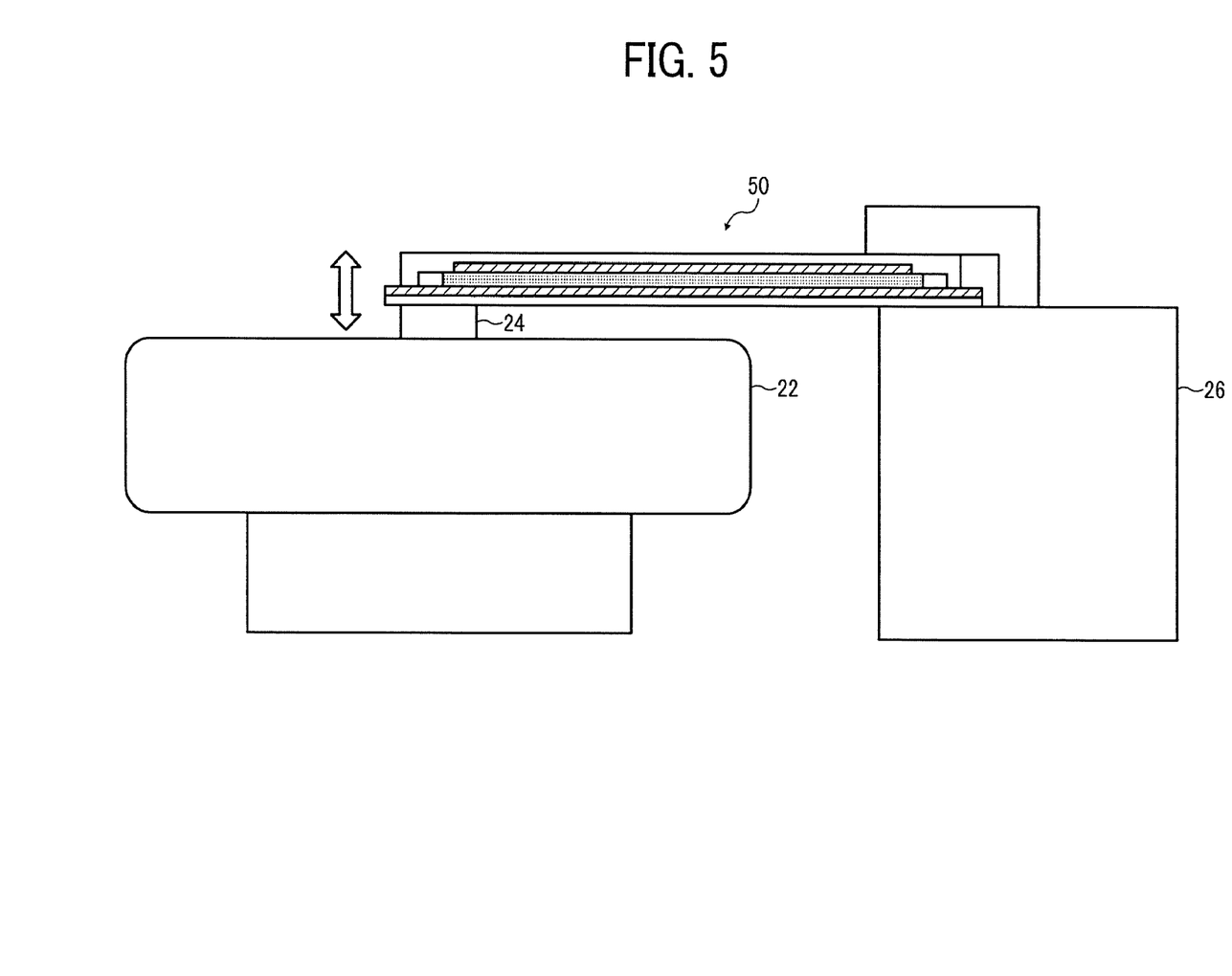
FIG. 5 is a schematic view of a vibration tester used for evaluating the light emitting element.

Specifically, as illustrated in FIG. 5, the left end of the light emitting element 50 was horizontally attached to a vibration head 24, having a diameter of 8 mm, of the vibration tester MES 151 represented by a reference numeral 22. The right end of the light emitting element 50 was supported by the Function Generator SG-1405 represented by a reference numeral 26. The light emitting element 50 was vibrated at an amplitude of 5 mm and a frequency of 10 Hz.

The evaluation results are shown in Table 1. Power generation performance is evaluated by a voltage difference between the minimum voltage and the maximum voltage measured by an oscilloscope. The voltage difference measured in Comparative Example 1 is standardized as 1. A standardized voltage difference of 5 or more is determined to be acceptable.

The results shown in Table 1 are average results among 5 samples. "Number of times" in Table 1 refers to the number of times when the voltage had decreased by 10% of the initial value. In Examples and Comparative Examples other than Comparative Examples 2 and 4, the test was stopped when the number of times when the voltage had decreased by 10% of the initial value reached 10,000.

In Table 1, the film thickness is represented by micrometers (μm).

TABLE 1

| | Configuration | | | | |
|---|---|---|---|---|---|
| | Intermediate Layer | Thickness (μm) | Surface Modification | Configuration of Power Generating Element | Electrodes |
| Example 1 | TSE3033 | 100 | Plasma Treatment | Upper Electrode Sliding | AL-PET® 9-100 |
| Example 2 | TSE3033 | 100 | UV Irradiation | Upper Electrode Sliding | AL-PET® 9-100 |
| Example 3 | TSE3033 | 100 | Electron Irradiation | Upper Electrode Sliding | AL-PET® 9-100 |
| Example 4 | TSE3033 | 100 | Electron Irradiation | Upper Electrode Sliding | AL-PET® 9-100 |
| Example 5 | TSE3033 | 100 | Electron Irradiation | Upper Electrode Sliding | AL-PET® 9-100 |
| Comparative Example 1 | PVDF with CuNi Electrode | 110 | N/A | Upper and Lower Electodes Attached | CuNi Sputtered Film |
| Comparative Example 2 | PVDF without CuNi Electrode | 110 | N/A | Upper Electrode Sliding | AL-PET® 9-100 |
| Comparative Example 3 | TSE3033 | 100 | N/A | Upper Electrode Sliding | AL-PET® 9-100 |
| Comparative Example 4 | Polypropylene | 100 | Corona Treatment | Upper Electrode Sliding | AL-PET® 9-100 |
| Comparative Example 5 | Polypropylene | 100 | Corona Treatment | Upper Electrode Point-Adhered | AL-PET® 9-100 |

| | Power Generation Property | | Durability Performance | | |
|---|---|---|---|---|---|
| | Standardized Voltage Difference | Number of Times (Decreased by 10% of Initial Value) | Evaluation | Number of Times (Decreased by 10% of Initial Value) | Evaluation | Overall Evaluation |
| Example 1 | 8 | 10,000 or more | OK | 1,000 or more | OK | OK |
| Example 2 | 9 | 10,000 or more | OK | 1,000 or more | OK | OK |
| Example 3 | 11 | 10,000 or more | OK | 1,000 or more | OK | OK |
| Example 4 | 11 | 10,000 or more | OK | 1,000 or more | OK | OK |
| Example 5 | 11 | 10,000 or more | OK | 1,000 or more | OK | OK |
| Comparative Example 1 | 1 | 10,000 or more | NG | 1,000 or more | OK | NG |
| Comparative Example 2 | 2 | 1,500 (with Electric Discharge) | NG | 232 (with Electric Discharge) | NG | NG |

TABLE 1-continued

| | | | | | | |
|---|---|---|---|---|---|---|
| Comparative Example 3 | 3 | 10,000 or more | NG | | OK | NG |
| Comparative Example 4 | 1 | 1,700 (with Electric Discharge) | NG | 265 (with Electric Discharge) | NG | NG |
| Comparative Example 5 | 3 | 10,000 or more | NG | 121 (Adhesion Part Broken) | NG | NG |

Evaluation 2: Durability Performance (90° Bending Durability)

A 90° bending test was performed using a Desktop Model Endurance testing Machine TCDM111LH (Rotary Reciprocating Unit) available from YUASA SYSTEM CO., LTD.

Figure 6A:
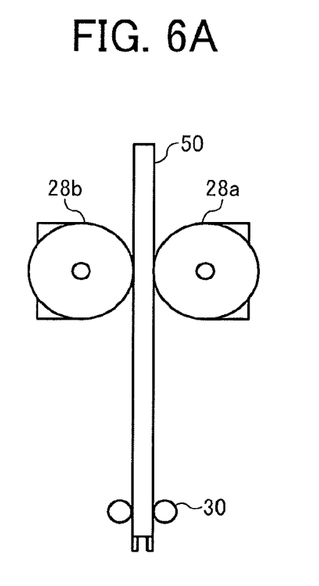
FIGS. 6A and 6B are schematic views for explaining a 90° bending durability test for evaluating the light emitting element.

As illustrated in FIG. 6A, a sample (the light emitting element 50) was set between a pair of R30 jigs 28a and 28b while one end thereof being fixed with a clamp 30. The sample was in a long strip-like form.

Figure 6B:
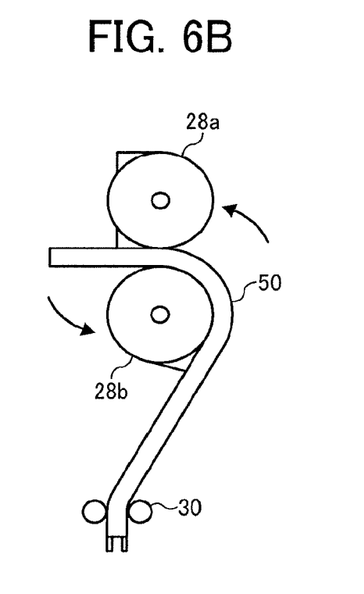

As illustrated in FIG. 6B, the R30 jigs 28a and 28b were displaced so as to bend the sample toward one side by 90° and toward another side by 90° thereafter. Such a motion was counted as one reciprocal motion.

The R30 jigs 28a and 28b were subjected to ten times of the reciprocal motion per minute. The voltage was monitored in the same manner as Evaluation 1. The number of times when the voltage had decreased by 10% of the initial value was counted. The other conditions were the same as those in Evaluation 1. The reciprocal motion was repeated for 1,000 times at most.

EXAMPLE 2

The procedure in Example 1 was repeated except that the surface modification treatment of the intermediate layer was performed by ultraviolet irradiation in place of the plasma treatment. Specifically, an ultraviolet emission lamp VL-215.0 (available from Vilber Lourmat) was used. The UV wavelength and the accumulated amount of light were set to 254 nm and 300 J/cm$^2$, respectively. The reaction atmosphere was a reactive nitrogen gas having an oxygen partial pressure of 5,000 ppm or less. A light emitting element thus prepared was subjected to the evaluations in the same manner as Example 1.

EXAMPLE 3

The procedure in Example 1 was repeated except that the surface modification treatment of the intermediate layer was performed by electron irradiation in place of the plasma treatment. Specifically, a line irradiation low energy electron beam irradiation source available from Hamamatsu Photonics K.K. was used. The irradiation dose was 1 MGy. The reaction atmosphere was a reactive nitrogen gas having an oxygen partial pressure of 5,000 ppm or less. A light emitting element thus prepared was subjected to the evaluations in the same manner as Example 1.

EXAMPLE 4

Figure 7A:
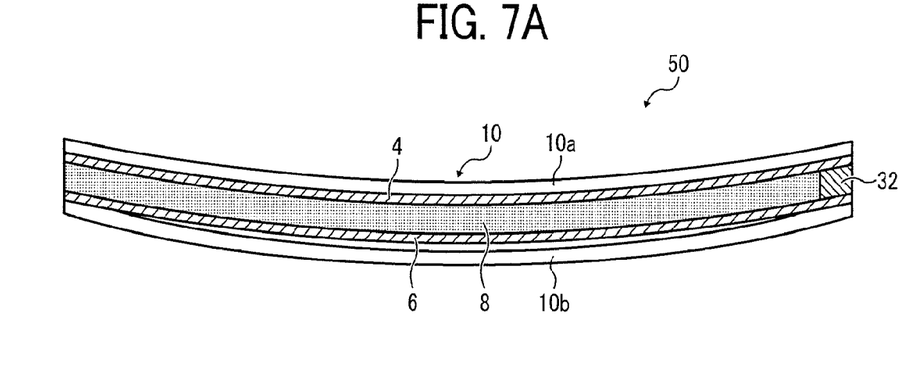
FIGS. 7A and 7B are vertical and horizontal cross-sectional views, respectively, of a modification of the light emitting element.
Figure 7B:
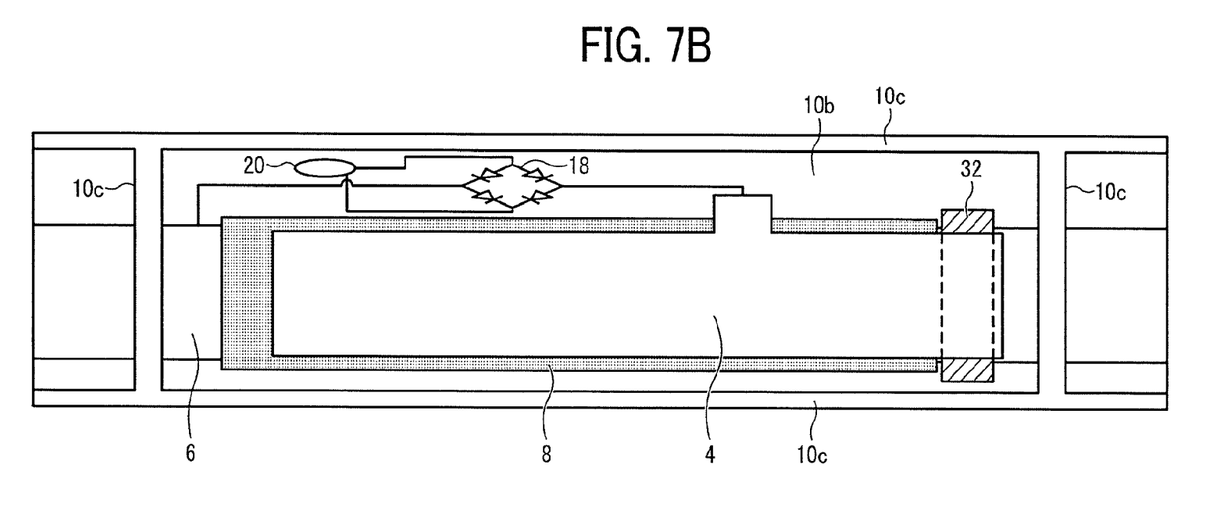

Example 4 shows one example of how the electrodes are fixed. As illustrated in FIGS. 7A and 7B, a part of the upper electrode 4 and a part of the lower electrode 6 are fixed to each other at one end sides thereof via an insulating member 32. When this element was bent, a sliding transfer is caused between the electrodes and the intermediate layer at the free end sides (unfixed sides) thereof.

EXAMPLE 5

Figure 8A:
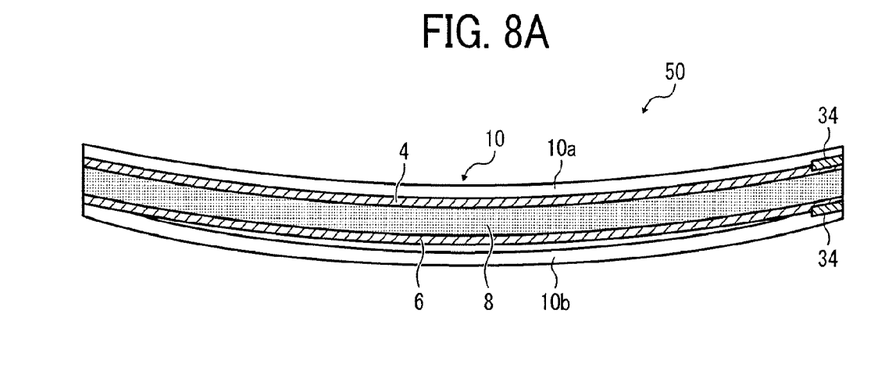
FIGS. 8A and 8B are vertical and horizontal cross-sectional views, respectively, of a modification of the light emitting element.
Figure 8B:
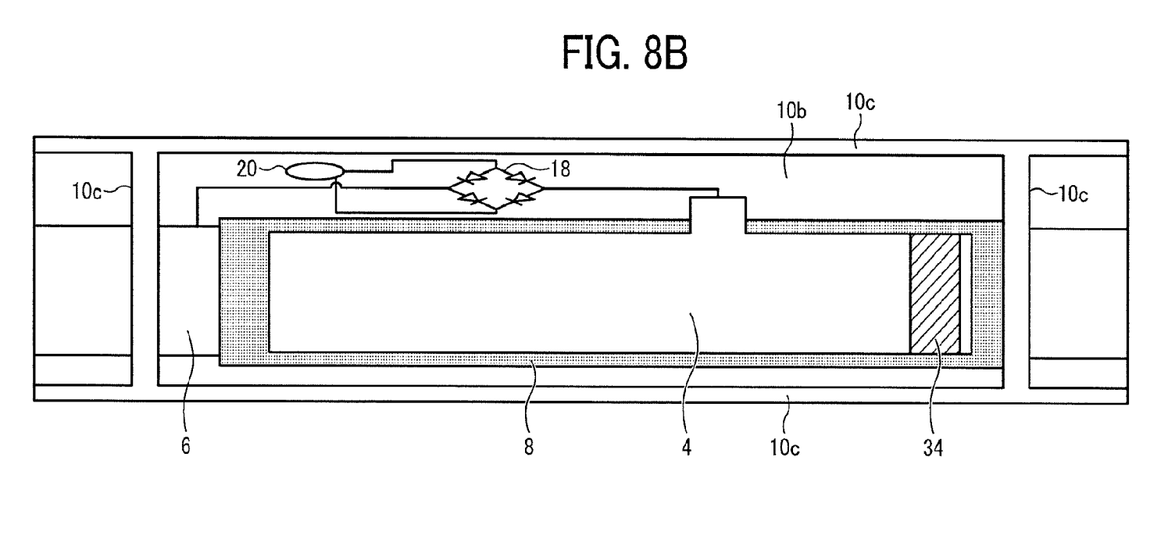

Example 5 shows another example of how the electrodes are fixed. As illustrated in FIGS. 8A and 8B, a part of the upper electrode 4 and a part of the lower electrode 6 are fixed to the exterior film 10 with respective jointing materials 34. When this element was bent, a sliding transfer is caused between the electrodes and the intermediate layer at the free end sides (unfixed sides) thereof.

COMPARATIVE EXAMPLE 1

A metal-coated piezo film sheet (Model No. 200 x 280 x 110 CuNi, available from Tokyo Sensor Co., Ltd.) was cut into a piece having longitudinal and lateral sides having lengths of 20 mm and 50 mm, respectively. After removing the aluminum parts from the AL-PET® 9-100 electrodes by etching, the upper electrode 4 and the lower electrode 6 were wire-connected in the same manner as Example 1 except that the electrodes were directly connected to the oscilloscope (Wave Ace 1001 available from LeCroy Corporation) without using LED. In place of the AL-PET® 9-100 electrode, the CuNi film that had been coating the piezo film sheet was used as an electrode.

COMPARATIVE EXAMPLE 2

The same metal-coated piezo film sheet used in Comparative Example 1 was etched with a ferric chloride aqueous solution (Etching Liquid H-200A available from Sunhayato Corp.). The silicone rubber material used in Example 1 was replaced with the above-etched sheet. The oscilloscope was connected in the same manner as Comparative Example 1.

COMPARATIVE EXAMPLE 3

The same silicone rubber used in Example 1 but had not been subjected to any surface modification treatment was used.

COMPARATIVE EXAMPLE 4

As the intermediate layer, a polypropylene (PP) film, the entire of which had been substantially uniformly charged by corona discharge, was used. A corona discharger includes a corona needle and an electrode facing each other, and a grid disposed between the corona needle and the electrode. A direct-current high-voltage power supply (HAR-20R5 available from Matsusada Presision Inc.) allows the corona discharger to cause electric discharge.

The grid can be supplied with a voltage from a grid electrode. The film was charged (formed into an electret)

under the following conditions. The charged film was used as the intermediate layer of a light emitting element.

Charging Conditions
Corona Needle Voltage: −10 kV
Grid Voltage: −1 kV

The potential difference between both surfaces of the electret was about 200 V. The electret was cut into a piece having longitudinal and lateral sides having lengths of 20 mm and 50 mm, respectively. The silicone rubber material used in Example 1 was replaced with the above-cut piece. The oscilloscope was connected in the same manner as Comparative Example 1.

COMPARATIVE EXAMPLE 5

As the intermediate layer, a polypropylene (PP) film having a thickness of 100 μm, the entire of which had been substantially uniformly charged by corona discharge in the same manner as Comparative Example 4, was used.

The potential difference between both surfaces of the electret was about 200 V. The electret was cut into a piece having longitudinal and lateral sides having lengths of 20 mm and 50 mm, respectively. The silicone rubber material used in Example 1 was replaced with the above-cut piece. The cut piece was formed into a dot pattern using a mask pattern. The dots, each having a diameter of about 1 mm and a thickness of 100 μm, were point-adhered to the electrodes at regular intervals of about 10 mm. The oscilloscope was connected in the same manner as Comparative Example 1.

With respect to power generation performance (Evaluation 1), a comparison between Examples 1-5 and Comparative Example 2 and 4 indicates that Examples 1-5 according to some embodiments of the present invention provide high power generation performance without causing electric discharge breakdown. With respect to durability performance (Evaluation 2), a comparison between Examples 1-5 and Comparative Example 5 indicates that Comparative Example 5 having a point-adherence structure has poor breakdown durability.

In addition, it is clear that silicone rubbers without surface modification provide poor power generation performance. Therefore, it is assumed that a change in the surface-modified surface of the silicone rubber is contributing to improvement of power generation performance.

EXAMPLE 6

Figure 9:
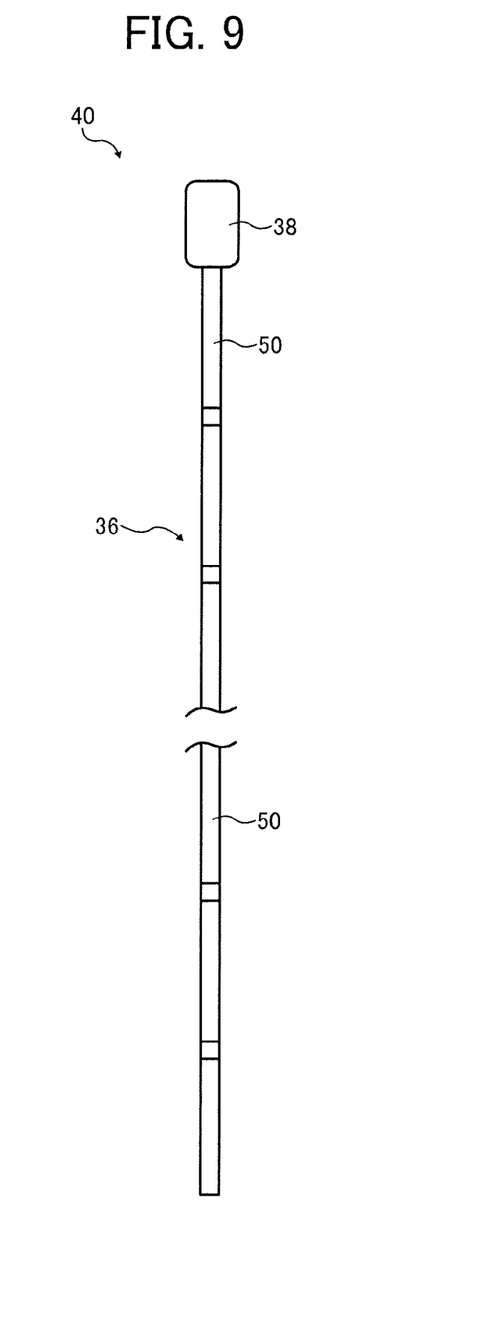
FIG. 9 is a schematic view of a rescue display device according to a fourth embodiment of the present invention, linearly extended.

As illustrated in FIG. 9, twenty pieces of the light emitting elements 50 of Example 1 were connected to each other to provide a band-like light emitting body 36 according to a third embodiment of the present invention. One end of the band-like light emitting body 36 was further connected to a float member 38 to provide a rescue display device 40 according to a fourth embodiment of the present invention. The float member 38 was a foamed polystyrene with each side having a length of 60 mm, 60 mm, and 30 mm.

Figure 10:
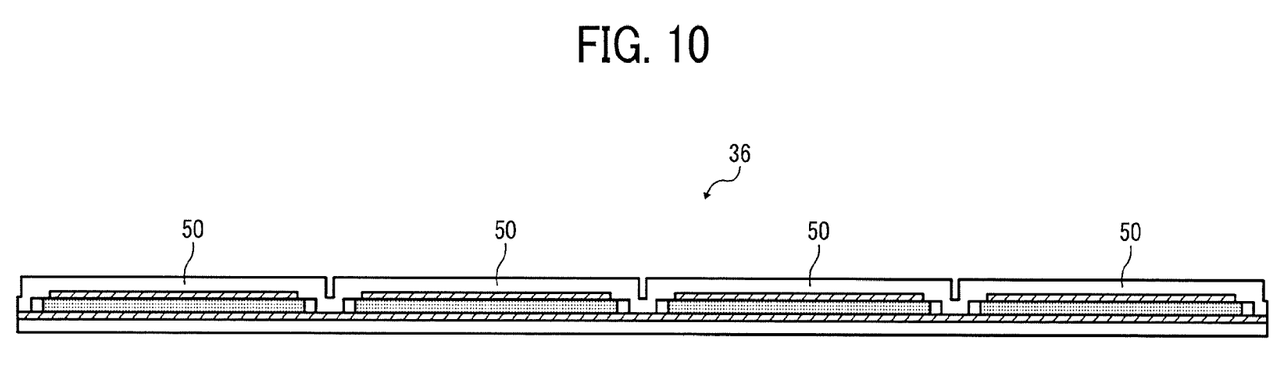
FIG. 10 is a vertical cross-sectional view of a band-like light emitting body according to a third embodiment of the present invention.

FIG. 10 is a cross-sectional view of the band-like light emitting body 36.

Figure 11:
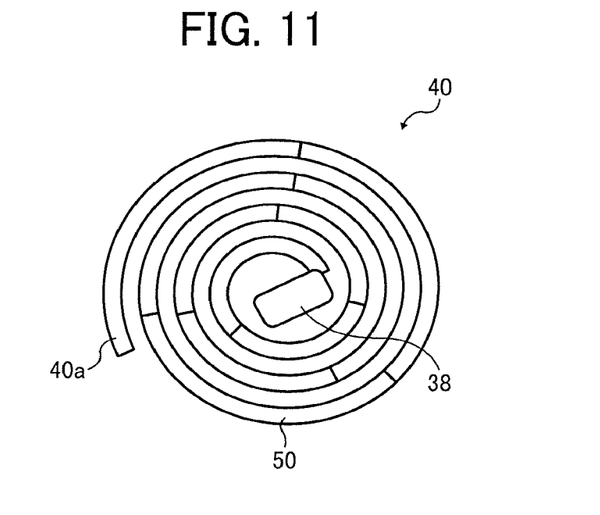
FIG. 11 is a schematic view of the rescue display device illustrated in FIG. 9, rolled up to be compact.

As illustrated in FIG. 11, the rescue display device 40 was rolled up around the float member 38 and fixed up with a piece of cotton thread to be compact.

Figure 12:
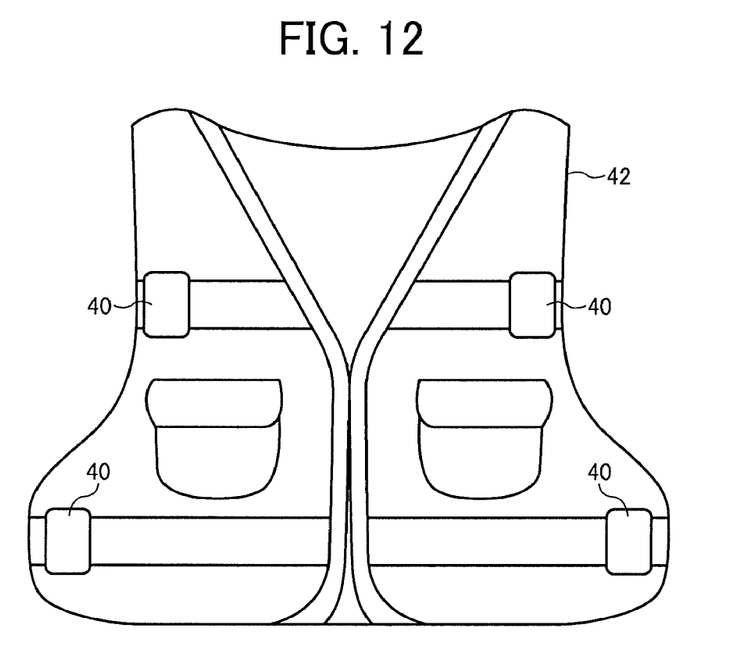
FIG. 12 is a schematic view of a fishing vest to which the compact rolled-up rescue display device is installed.

As illustrated in FIG. 12, a fishing vest 42 to which the compact rescue display devices 40 were installed was prepared.

Specifically, the rescue display device 40 was attached to the fishing vest 42 by sewing an attaching part 40a of the rescue display device 40, illustrated in FIG. 11, on the fishing vest 42 with a piece of nylon thread.

When a person wearing the fishing vest 42 dived to a swimming pool and swam therein, it was confirmed that the rolled rescue display device 40 became loose, and each power generating element was bent by waves generated by the person's swimming, generating power. Thus, the light emitting diodes were put on and light arrays which were visible even under absence of light were formed.

It is easy to find a person wearing the fishing vest 42 even when he/she is floating on the ocean.

Thus, a rescue display device is provided, which helps find a person who has accidentally fallen into water or ocean during night-time.

The compact rescue display device 40 may be fixed up with a piece of a water-soluble thread.

The power generating element according to an embodiment of the present invention is capable of generating power when gently bending (deforming) in water.

The above-described piezo film sheet is more sensitive to stretching, especially stretching in the rolling direction, than compressing. Therefore, in order to improve power generation performance, the piezo film needs to be bent at a sharp angle. The piezo film cannot be expected to improve power generation performance even when gently deforming in water by an external force caused by water current.

The power generation effect is caused by a sliding transfer either when the intermediate layer is joined to neither of the electrodes, or when the intermediate layer is joined to only one of the electrodes.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A power generating element comprising:
a pair of electrodes; and
an intermediate layer disposed between the pair of electrodes, the intermediate layer including an insulating elastic body,
wherein the power generating element is flexibly bendable when receiving an external force, while causing sliding motion between at least one of the electrodes and at least one surface of the intermediate layer which faces the at least one of the electrodes, due to a difference in curvature between the electrodes and the intermediate layer.

2. The power generating element of claim 1, wherein the at least one surface of the intermediate layer which faces the at least one of the electrodes, between which the sliding motion is caused, is a surface processed by plasma treatment, corona discharge, electron irradiation, ultraviolet irradiation, ozone treatment, or radiation exposure.

3. The power generating element of claim 2, wherein the insulating elastic body includes a silicone rubber.

4. The power generating element of claim 1, wherein the electrodes are fixed in part to each other via an insulating member.

5. The power generating element of claim 1, further comprising a flexible film to seal the pair of electrodes and the intermediate layer therein.

6. The power generating element of claim 5, wherein at least one of the electrodes is fixed in part to the flexible film.

7. A light emitting element comprising:
the power generating element of claim 5; and
a light emitting diode connected to the power generating element via a rectifier circuit.

8. A band-like light emitting body comprising:
a plurality of the light emitting elements of claim 7 connected to each other in a band-like shape.

9. A rescue display device comprising:
a float member; and
the band-like light emitting body of claim 8 installed to the float member.

\* \* \* \* \*